US006476317B1

(12) United States Patent
Frederickson et al.

(10) Patent No.: US 6,476,317 B1
(45) Date of Patent: Nov. 5, 2002

(54) RADIATION SHIELD USING ELECTRICAL INSULATING MATERIALS AND THE SPACECHARGE FIELDS THEREIN

(75) Inventors: Arthur R. Frederickson, Pasadena, CA (US); Stanley Woolf, Lexington, MA (US); John C. Garth, Albuquerque, NM (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 09/390,898

(22) Filed: Sep. 7, 1999

Related U.S. Application Data

(63) Continuation-in-part of application No. 08/893,064, filed on Jul. 15, 1997, now abandoned.

(51) Int. Cl.[7] .................................................. H05K 9/00

(52) U.S. Cl. .............................. 174/35 MS; 174/35 R; 361/816

(58) Field of Search .......................... 174/35 R, 35 MS; 361/816, 818, 800

(56) References Cited

U.S. PATENT DOCUMENTS 4,978,812 A 12/1990 Akeyoshi et al.
4,980,223 A * 12/1990 Nakano et al. ............ 428/198

* cited by examiner

*Primary Examiner*—Dean A. Reichard
*Assistant Examiner*—Hung V Ngo
(74) *Attorney, Agent, or Firm*—Thomas C. Stover

(57) ABSTRACT

The invention provides improved shielding from high energy radiation, especially radiation in the form of electrons with kinetic energy from 0.1 to 10 million electron volts. The improvement is produced by the build-up of an electric field in the insulating material which acts to further attenuate or deflect the penetration of such radiation. The electric field builds up in the insulator and surrounding media because of the stopping of charge stemming from prior impinging radiation.

7 Claims, 11 Drawing Sheets

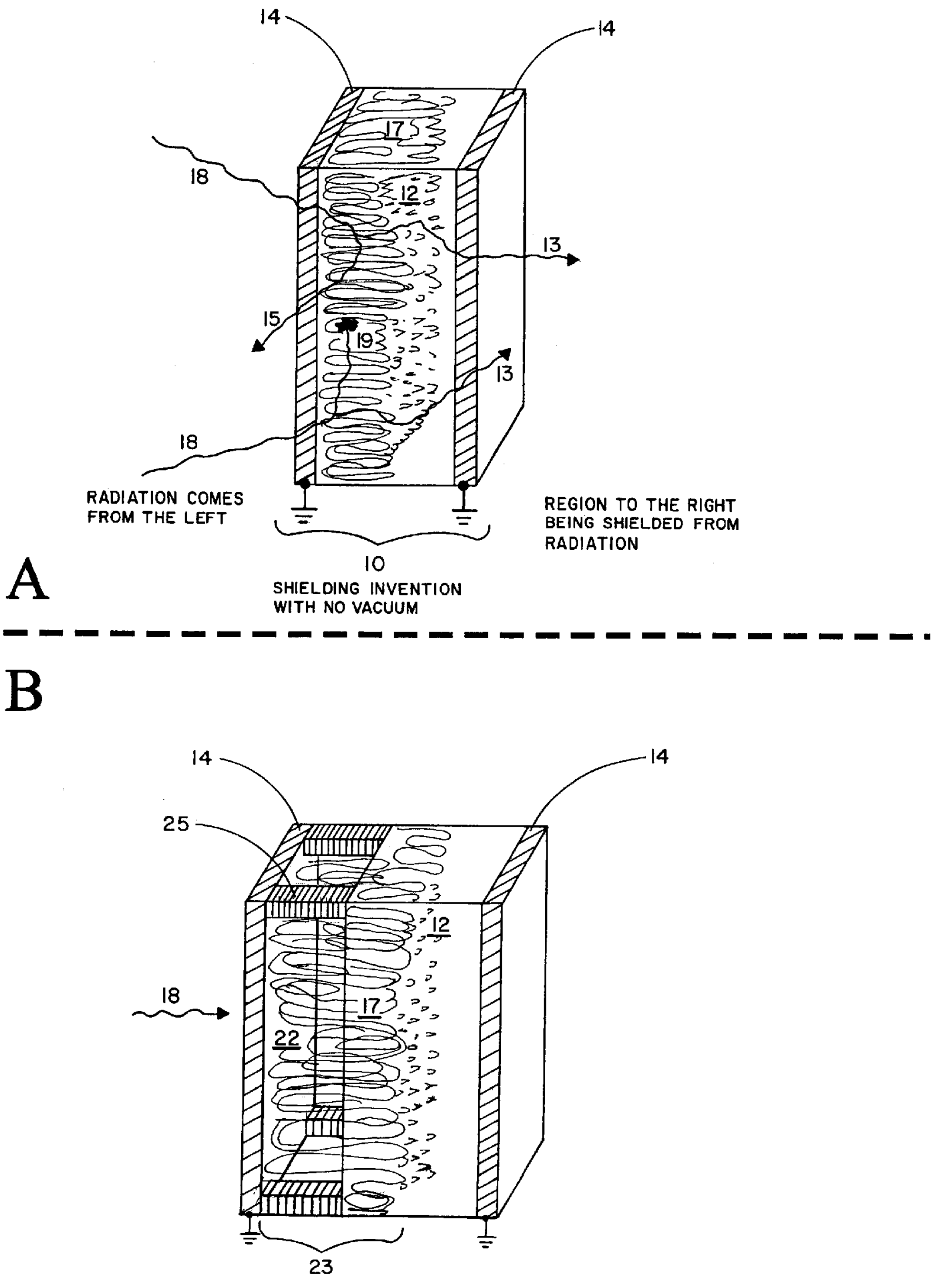
FIG. 1 A/B

RADIATION SHIELD USING ELECTRICAL INSULATING MATERIALS AND THE SPACECHARGE FIELDS THEREIN

CROSS REFERENCE TO RELATED PATENT APPLICATIONS

This application is a continuation-in-part of parent application U.S. Ser. No. 08/893,064, filed Jul. 15, 1997, abandoned.

STATEMENT REGARDING FEDERALLY SPONSORED RESEARCH OR DEVELOPMENT

The invention described herein may be manufactured and used by or for the Government for governmental purposes without the payment of any royalty thereon.

BACKGROUND OF THE INVENTION

1. Field of the Invention

This invention relates to a shield for high energy radiation particularly one which enables the build-up of an electric field which acts to attenuate the penetration of such radiation.

2. Description of Related Art

The present invention relates to radiation shielding, and, in particular, to shielding using insulating materials.

A shield is placed between the source of radiation and a sensitive element for the purpose of reducing the irradiance upon the sensitive element. The shield attenuates or reflects some of the radiant energy so that less radiation arrives at the sensitive element. Usually one finds that increased shielding material either in depth or density provides increased attenuation. Until recently, the penetration of high energy (HE) electrons through slab shields has been modeled without including the effect of electric field on the trajectory of the electrons. Experimental data on the development of the electric fields in irradiated insulating polymethylmethacrylate (PMMA) slabs provided the impetus for developing a Monte Carlo version of electron transport code that includes the effect of electric field. Several experimenters had observed that penetrating dose is decreased as the electric fields accumulate, but a full parametric study for these observations has been unavailable. The lack of a complete model relegated the experiments to interesting observations that could not be extrapolated to other situations.

Theoretical models of space charge evolution and dose in irradiated insulators at high electric fields are improved by the inclusion of the effects of the electric field on the scattering of fast electron. Consideration of these effects impacts on the development of the dose, charge, fast electron current and total current. Each of these items is calculated in computer simulation with its full time and spatial dependence.

New measurements by others have provided electric field and charging data on insulators irradiated by high energy (HE) electron beams. Previous predictions of electric field and charge distributions as a function of time have not included the effects of the electric field on the motion of the HE electrons. For electrons well below 100 KeV, where the material stopping power is large, the effects of the electric field are less important. It has been observed for electrons above 1 MeV that their trajectories are foreshortened in charged insulators.

Recent experimental data has one striking difference from the previously published theoretical data for partially penetrating electron beams. In the old theoretical data the charge centroid was predicted to move away from the surface through which the monoenergetic beam entered as irradiation progressed. The old theory predicted a much deeper depth for the charge centroid than the recent data showed. Additionally, the old theory predicted only a small sharpening of the spatial distribution of stopped electrons as time progressed. Instead, experiments found that the centroid of charge moved rapidly toward the entrance surface and developed a sharply defined peak of stopped electrons. It was obvious that the effect of the electric field on the HE electrons must be included in any good theory.

Taking into account the electric field build-up in Monte Carlo simulation on the motion of the HE electrons gives better agreement with experiments than do the older models.

The prior theories for estimating both the distribution of space charge and the internal electric fields were obtained using the procedure as disclosed in "Radiation Induced Electrical Current and Voltage in Dielectric Structures," AFCRL-TR-74-0582 (1974) by A. R. Frederickson.

The combination of a Monte Carlo calculation including electric fields to calculate HE current and the prior theory to calculate total current yields improved predictions of electric field build-up in a dielectric slab as a function of time. This is of concern when the incident beam energy exceeds 50 Kev and the total dose exceeds about 50 krads. The improved predictions, in agreement with experiment, predict that the charge centroid moves toward the incident surface, instead of away from it as is the case if the field effects on HE electron motion are neglected. The improved predictions, also in agreement with experiment, indicate that the concentration of charge sharpens to a more narrow peak as time during irradiation progresses.

As a result of the development of the electric field, the amount of radiation dose which penetrates to depths within the insulator and beyond is strongly changed. At most depths the dose is decreased by the electric field and therefore the insulator acts as an improved radiation shield. Thus, there exists a need for an improved shielding device and a process for determining the performance of the improved shielding device.

SUMMARY OF THE INVENTION

In this invention, previous high energy radiations into the shield produce high electric fields which, in turn, provide increased attenuation to subsequent high energy photon and electron radiations. The use of the electric field has the advantage of increasing the attenuation of high energy radiation without adding extra weight to the shielding material.

Therefore, one object of the present invention is to provide a process for developing electric field and charge storage in insulators acting as radiation shields with approximately a factor of two improvement in shielding effectiveness compared to non-insulating shields.

Another object of the present invention is to provide a process to more accurately predict electric field levels which would indicate approach of breakdown threshold.

Another object of the present invention is to provide a process for better understanding the breakdown of space borne electronic insulation due to HE electron radiation belts.

Another object of the present invention is to provide a process for calculation of shielding effectiveness for insulating shields for any radiation composed of high energy electrons and/or photons in order to predict for cases which cannot be experimentally studied.

Another object of the present invention is to provide a process to protect external electrical circuits from the effects of spontaneous electrical breakdown pulses that may occur in the insulator shield.

These and many other objects and advantages of the present invention will be readily apparent to one skilled in the pertinent art from the following detailed description of a preferred embodiment of the invention and the related drawings.

BRIEF DESCRIPTION OF THE DRAWINGS

FIGS. 1A and 1B are perspective schematic views of two embodiments of the radiation shield of the invention.

DESCRIPTION OF THE PREFERRED EMBODIMENT

Figure 1C:
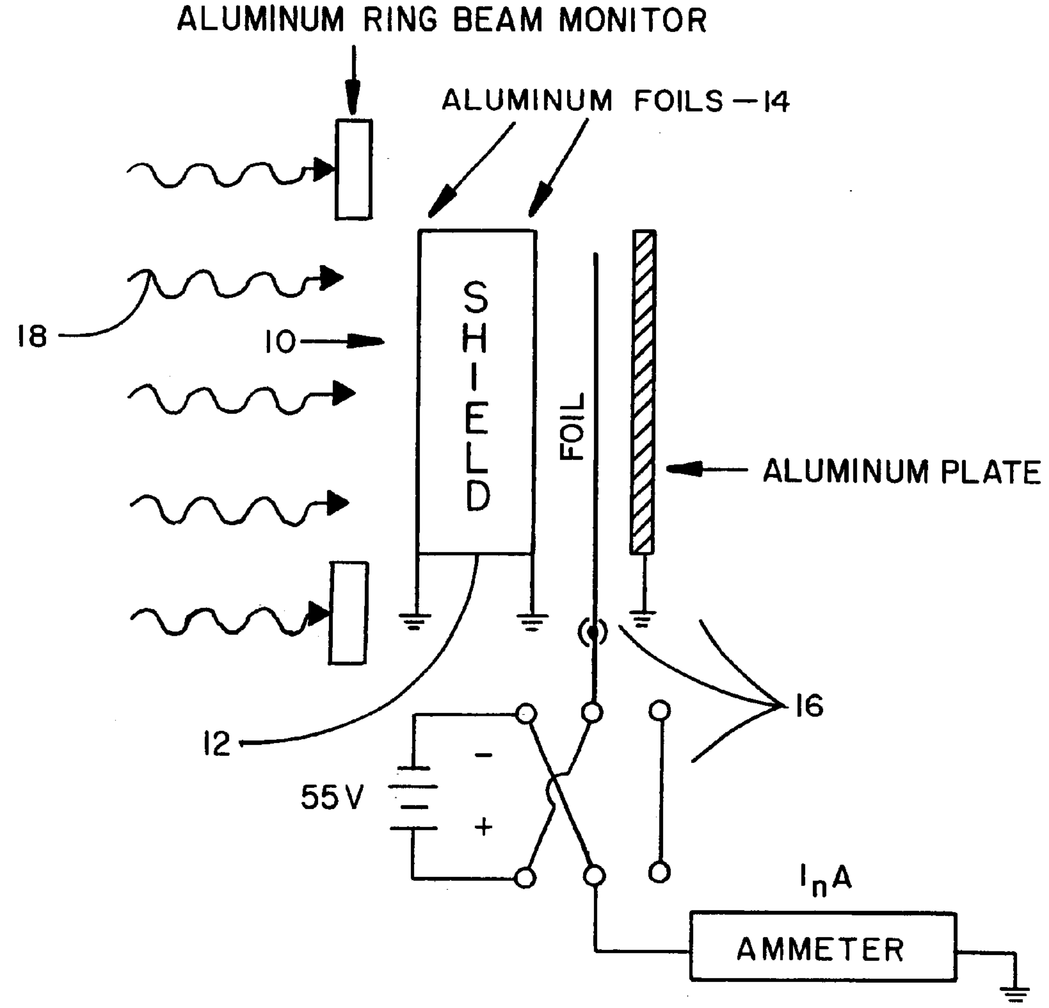
FIG. 1C is a schematic of the test setup for the radiation shield of FIG. 1A.

The radiation shield 10, shown in FIGS. 1A and 1C, includes a solid mass of electrically insulating material 12 placed in proximity to conductive films or foils 14 which are usually grounded or connected to a circuit ground on bodies such as a spacecraft. The radiation interacting with the insulating shield 10 will cause to be developed a high electric field(s) near or in the insulator to produce regions of space wherein the radiation dose is attenuated over and above the attenuation produced by a similar solid mass of non-insulating material. Highly conducting electrodes, shown as foils 14 are placed in proximity chosen to maximize the attenuation of dose in the desired spatial region and to minimize problems resulting from occasional spontaneous electrical discharges in the shield. An improved process for calculation of the radiation dose is provided in order to optimize design of the shield with respect to variations of parameters including electrical conductivity, mass thickness, radiation spectra, location of sensitive elements to be shielded, shape of insulator and electrodes, and development of spontaneous discharges.

Therefore, this improved process uses the Monte Carlo simulation as follows:

(1) estimate the initial radiation-induced HE electron current, $J_R(z)$ and dose rate profile D(z), either directly from the Monte Carlo data or using a modification to Tabata's energy deposition profile algorithm;

(2) Integrate the continuity equation for current and charge over a short irradiation time interval, Δt, from time t−Δt to t to obtain the charge density (z,t) at time t. The time interval Δt is held sufficiently small to allow for valid numerical integration (i.e., it is assumed that J and E do not vary much over this time interval).

(3) use the integral form of Coulomb's law to solve for the internal electric field E(z,t);

(4) determine the depth dependence of the conductivity in the insulator based on the dose rate profile and the conduction physics in the insulator;

(5) determine the conduction current profile at time t based on (3) and (4) above and add the conduction current to the radiation-inducted current in (1) above to obtain the total current profile in the presence of the field E(z,t);

(6) with the total current, return to step (2) above and iterate through the process, steps (2 to 5), for another time interval. Repeat the iteration as often as necessary;

(7) after every 100 or more Δt, i.e., steps (2 to 6), interrupt the iteration and recalculate $J_r(z,t)$ and D(z,t) using the electric field at this time;

(8) repeat step (7) as often as necessary to recalculate $J_R(z,t)$ and D(z,t) for a predetermined number of times for different electric fields.

The present invention is used to extrapolate from experimentally verified cases to other radiation spectra and changed shield geometry.

The electric field Monte Carlo code successfully predicts the magnitude of space charge electric fields because it includes dose-related conductivity and field-enhanced conductivity in order to properly model space charge build-up in the material. At the moment, we know the values for the material-specific parameters only in PMMA, so PMMA was chosen for experimental investigation. There is no reason to believe that PMMA is optimum, many other good insulator materials will work equally well, or perhaps better.

The stopping power for electrons is relatively small over the energy interval 300 keV to 3 Mev. A large electric field may therefore alter the trajectories of electrons in this energy range, or at energies near this range. This energy range is of great interest for spacecraft dosimetry because electrons in this range deposit most of the dose experienced by lightly shielded electronics at medium to high orbital altitudes. The embodiment is designed for this energy range.

Extensive study of electric field storage and/or charge storage in relatively thin insulators has been performed in several materials under 2 to 20 keV electron beam irradiations. Several methods for measuring charge profile in thin insulators exist, but have not been adapted to thicker insulators such as ours. Above 100 keV we find only one measurement of electric field profile. Measurements below 20 keV have not yet indicated that the penetrating electron trajectories inside the insulator are affected by the electric field. Indeed, we had earlier performed a simplified Monte Carlo study below 20 keV to find that electrons inside insulators are not measurably deflected by the developing spacecharge fields. This is reasonable because the stopping power for electrons below 20 keV is much greater than the electric field that can be sustained in solid material.

The insulator material must survive the total dose to which it is exposed in service. Most particularly, the conductivity must remain low during its life expectancy. PMMA is known to satisfy the requirements for spacecraft exposures so first tests were performed using it. In other environments where the total dose in the shield is very high (>10$^9$ rads) polymeric shields would be problematical, so other kinds of material would be chosen.

The effects investigated in this study are not expected to occur with proton irradiation because the electric field is a negligible perturbation on the proton stopping power. Gamma and X-rays deposit dose by first exciting secondary HE electrons. In principle, the space charge electric field developed by the stopped secondary HE electrons near interfaces where dose enhancement occurs could alter the dose-depth profile in good insulator material. Thus the "shielding effectiveness" of insulator structures could also be affected locally by electric field build-up under photon irradiation.

THE EXPERIMENT FOR SPECIFIC EMBODIMENTS

FIGS. 1A and 1B further describe the invention. The prior art simply uses material to stop, attenuate or slow the particles and rays of the radiation. In this invention, a particular arrangement of materials is used in order to develop a static electric field in the shield that enhances the shielding effectiveness of the material per the first embodiment of the invention shown in FIG. 1A.

As in the prior art, the mass of the components of FIG. 1A alone provides shielding. Radiation 18 such as fast electrons, gamma rays or X-rays enter the shield from the left side. The fast electrons in the shield associated with the radiation can penetrate the shield as shown at 13. Of course the mass of the shield will cause the energy intensity of the penetrating particles and rays to be less than that of the incident particles and rays. Some of the radiation on the left will not penetrate to the right side.

But in this invention the materials are chosen with specific properties and arranged as in the figures. In FIG. 1 an electrically insulating material 12 is covered on both sides by a grounded conductive film or metal foil 14. As the radiation proceeds, a static electric field 17 is built up in the insulator 12. Although the static field is everywhere in the insulator, its effect on the radiation is most intense near the left foil. Instead of penetrating at 13, in this case the fast electrons associated with rays 18 can be reflected by the electric field as at 15 or deflected to be fully absorbed in the insulator as at 19. It is in this manner that the electric field enhances the shielding effectiveness over that of the prior art.

Figure 8:
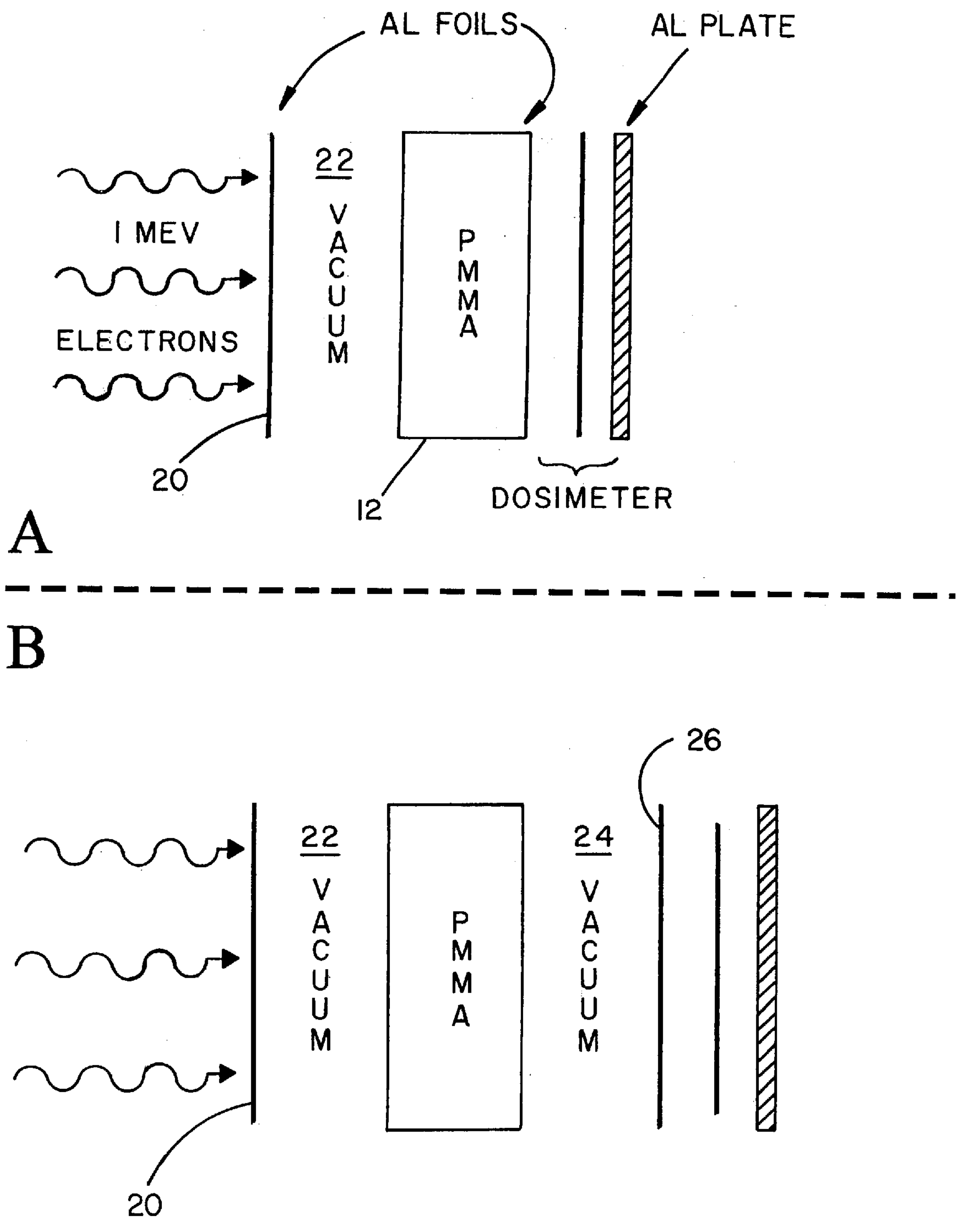
FIGS. 8A and 8B illustrate two geometries for the evacuated shield.

The effect of the electric field can be further enhanced by introducing an evacuated space as shown in FIGS. 1B and 8A which describes the second embodiment of the invention having one vacuum space. The electric field 17 in FIG. 1A extends into the vacuum space 22 in FIG. 1B. Since the electric field in the vacuum is constant across the vacuum, the wider one makes the vacuum, the better the electric field attenuates the passage of the radiation. Thus the electric field retards the fast electrons in the evacuated space to further diminish their penetration to the right of the shield.

Although the static electric field extends throughout the insulator, its effect on the passage of radiation is dominant in the left half of the device where it slows the fast electrons. Thus the region 17 indicates where the electric field has the most effect upon motion of fast electrons. Region 17 does not directly indicate where the electric field has the greatest magnitude. In FIG. 1B the electric field throughout region 23 which is composed of 17 and 22, provides enhanced shielding effectiveness.

The leftmost foil or film can be suspended by any means. One means is indicated by spacers 25 in FIG. 1B. Other means are certainly possible. Spacers 25 can be composed of either conducting or insulating (preferred) materials.

A third embodiment having two vacuum spaces is described below in FIG. 8B. The effect of the second vacuum space 24 shown on the right of FIG. 8B is primarily to increase the static electric field in the left vacuum space. It is the field in the left vacuum space that provides the beneficial enhanced shielding.

Irradiations

FIG. 1C indicates the method for testing the inventive shield laboratory irradiations are performed to verify the simulation code and to test specific embodiments of the insulating shield. The code is then used to predict shielding effectiveness for real space spectra and for other embodiments. This study was performed near 1 MeV at a low laboratory dose rate, approximately 10 to 100 times the dose rate seen in the hottest of Earth's space electron belts. Slower irradiations would have been exceedingly difficult for both the dose measurement and continuous operation of the radiation machine. Faster irradiation would have been further from the space conditions.

The Dosimeter 16

The dosimeter 16 is a secondary electron emission dosimeter which has the advantage of highly linear response and extreme depth specificity (perhaps better than 100 angstroms). The dosimeter 16 represents the sensitive material element within which the radiation dose is to be reduced by the shielding. The arrangement of slab shield 12 and dosimeter 16 is shown in FIG. 1C. The dose in the surface of the dosimeter foil 16 is proportional to the change in secondary electron current when the dosimeter bias is reversed. Some of the current to the foil 16 is composed of stopped HE electrons from the primary beam 13, but this current does not change when the bias is reversed, and it is therefore removed from the measurement of dose. Also, an evacuated dosimeter makes it simple to provide dose measurements in the vacuum shield cases discussed below.

Figure 2:
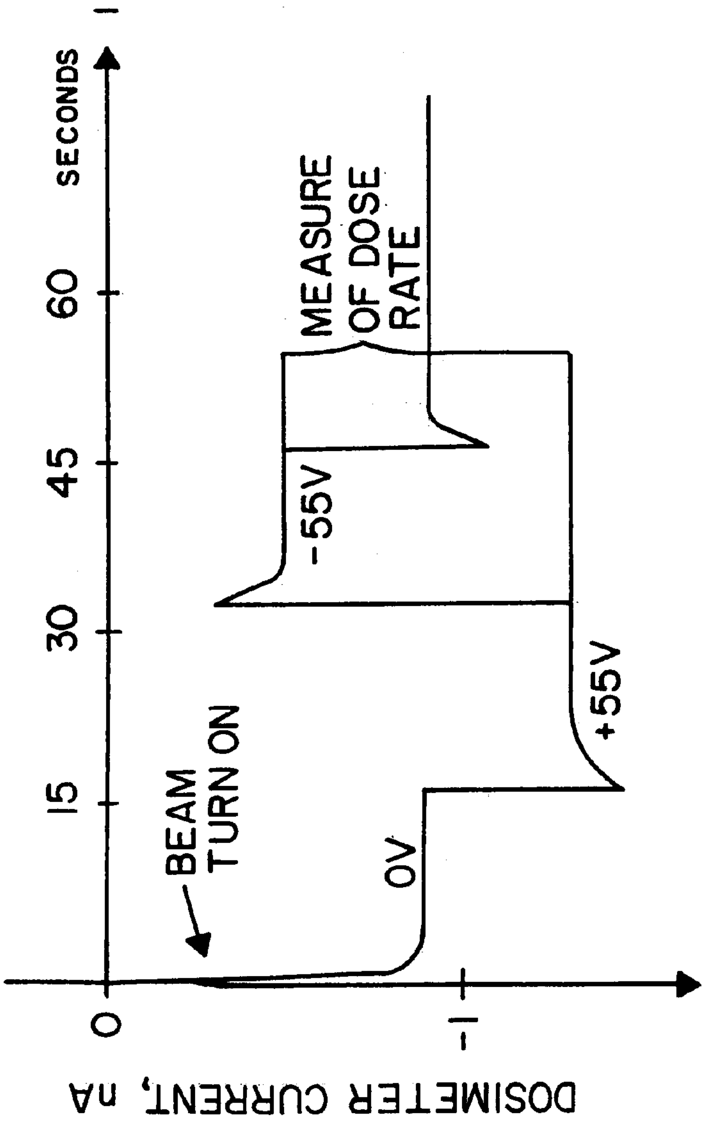
FIG. 2 illustrates a typical dosimeter measurement.

A typical dosimeter measurement is shown in FIG. 2. At zero bias the meter current is only due to the stopping of HE electrons in the thin aluminum foil. The transient spikes of current are due to dielectric polarization of the coaxial cables caused by the switched bias voltage. It takes about 15 seconds for the cable dielectric polarization currents to decay so that the remaining current is due to secondary electrons. Thus it takes nearly a minute to measure the dose rate, D.

The Slab Shield 12

Radiation shields are often, but not always, in the form of slabs of uniform thickness. The grounded electrodes being foils 14 in this particular embodiment are important since they help to define the electric field in the shield 10. The electrodes form the boundaries of the shield structure so that the incident radiation is not affected by stray fields. The tests were performed with the electrodes both on, FIG. 1, and spaced away from, FIGS. 8A and 8B, the slab of PMMA. The grounded electrodes 14 also protect external objects from electrostatic discharge effects inside the shield. The PMMA samples were 2.82 mm thick. One may multiply the thickness (cm) times the density of PMMA (1.19 g/cm3) to find that the samples are 335 mg/cm2 thick.

The thin aluminum electrodes 14 can be spaced away from the PMMA by an evacuated space. Electric fields in the evacuated space can act as weightless shielding. The vacuum in this geometry provides improved shielding without adding weight.

It is important to use a simulation model to evaluate features of the device beyond those measured in the experiment. Variations in incident electron spectra, dose as a function of depth beyond the shield, importance of conductivity and other features are of interest. It is only in PMMA that we have confirmation that our modeling is satisfactory. Thus PMMA was chosen for the bulk of these tests.

EXPERIMENT RESULTS

Simple Shield, No Vacuum (FIG. 1A)

Figure 3:
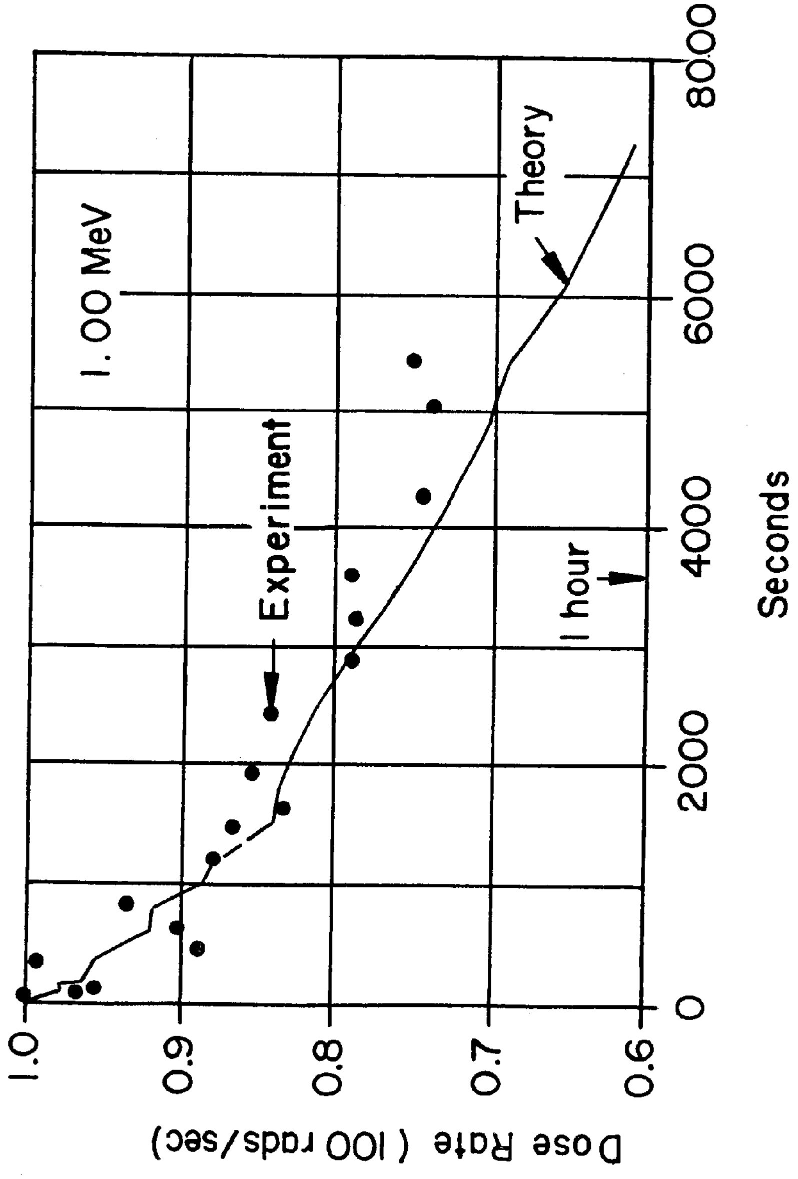
FIG. 3 illustrates by chart the dose rate behind 2.82 mm PMMA shield with 0.56 nA/cm$^2$ 1 MeV electrons.

FIG. 3 shows the attenuation of penetrating dose as the electric field builds up under 1.0 MeV incident electrons. The scatter in the experimental data is a good indication of the random error in measurements. The scatter in the theory occurs because the calculation is not continuous; it recalculates the electric field only at specific times chosen by the operator of the computer. The time required for a calculation is proportional to the number of times one recalculates the electric field. The calculation shown here took 24 hours on a '486 PC computer. Similar results were obtained at 900, 950, 1050 and 1100 keV. By running the calculation for, say, 100 hours a smoother theoretical curve would result but the benefit of doing so is small.

Figure 4:
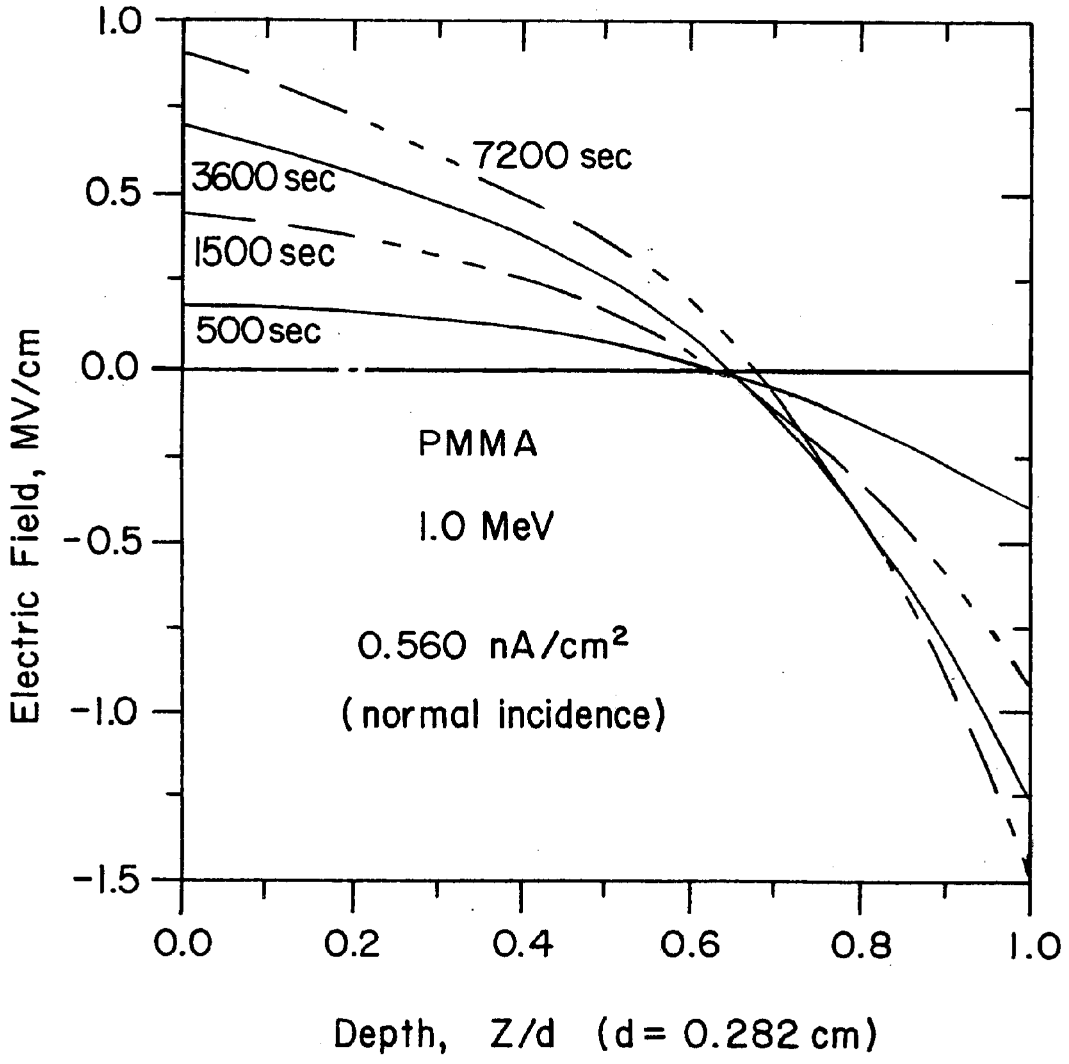
FIG. 4 illustrates the calculated electric fields versus depth at several times during the irradation of FIG. 3.
Figure 5:
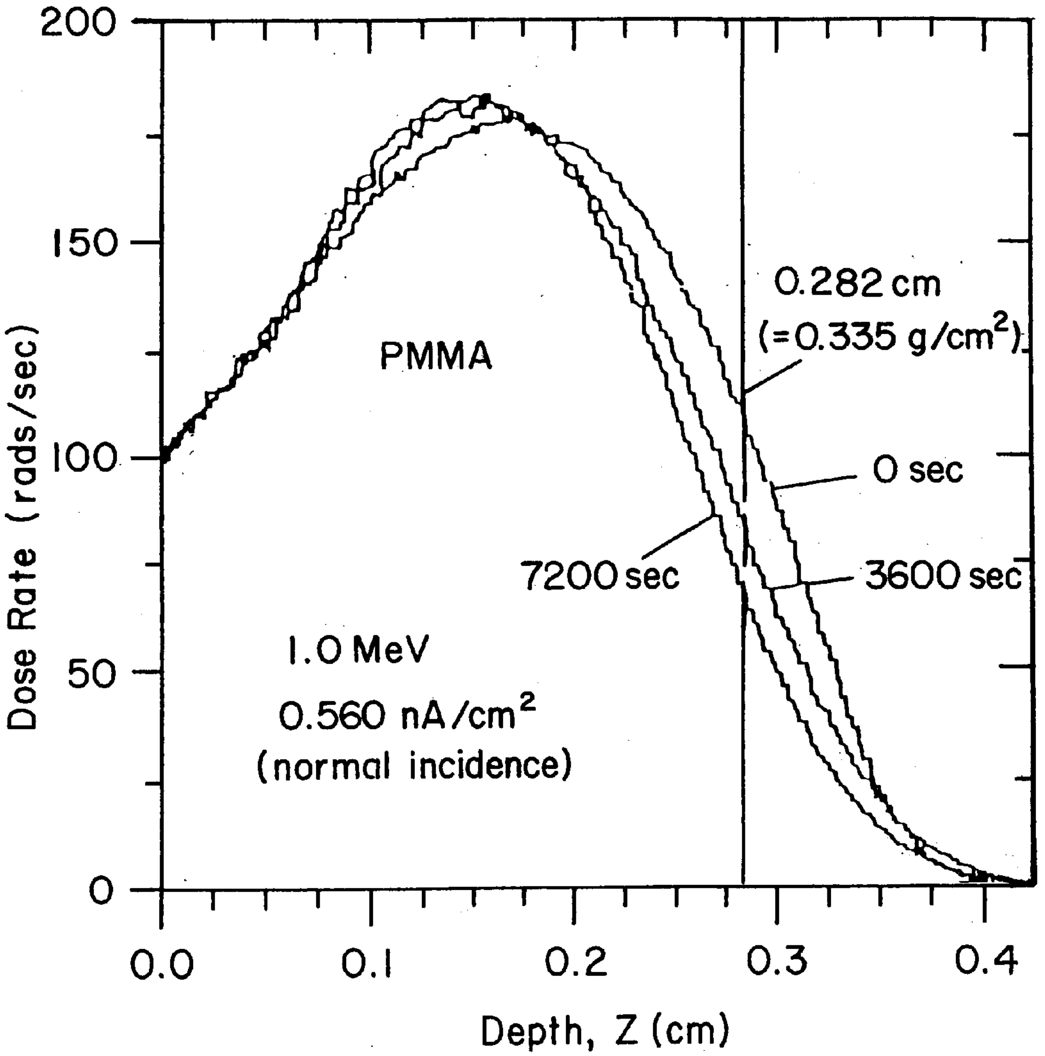
FIG. 5 illustrates the calculated dose rate versus depth at various times during the irradiation of FIG. 3.
Figure 6:
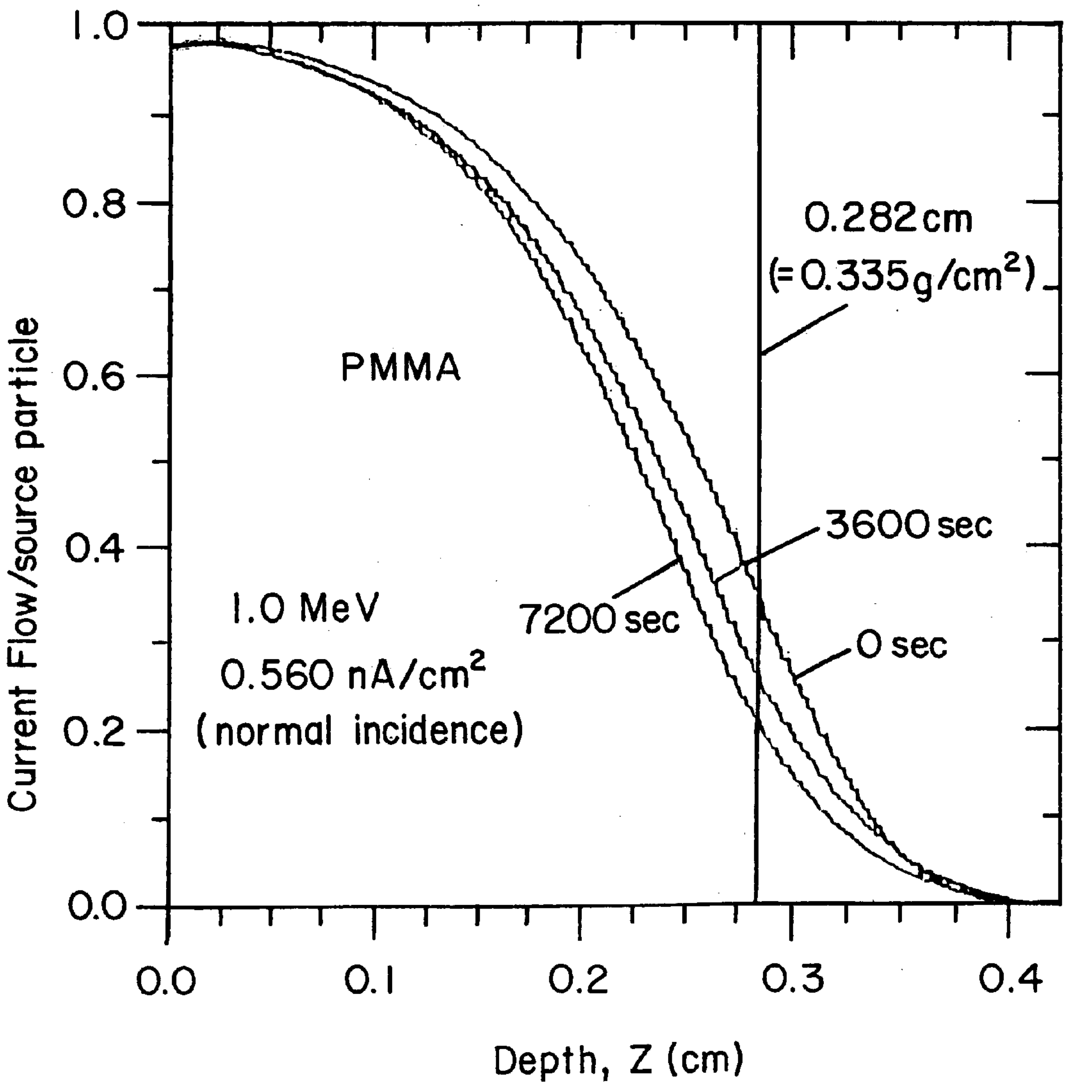
FIG. 6 illustrates the calculated penetration depth of HE electron current at various times during the irradiation of FIG. 3.

The agreement between the experimental and calculated doses at 2.82 mm depth provides some assurance that the theory is correct. The theory has the advantage of allowing evaluation of dose and many other observables. FIG. 4 describes the calculated electric field buildup that produced the dose attenuation in FIG. 3. FIG. 5 shows the calculated dose at all depths for three selected times. In this case the dose is arbitrarily continued to deeper depths of PMMA. The secondary emission dosimeter was located only at the depth 2.82 mm. FIG. 6 shows how the penetration of HE electron current is retarded by the buildup of electric field. Based on the theoretical estimate in FIG. 5, it seems that the shielding effectiveness is enhanced up to a factor of two for a range of thicknesses from 60% to 80% of the HE electron range.

Electrical breakdown pulses were frequently seen in the wires connecting the electrodes to ground. The breakdowns had no effect on the penetrating dose because negligible field was lost inside the insulator during the breakdown pulses. This is different from the vacuum tests described below.

The use of FR4 circuit board insulation instead of PMMA (data not shown) found less than five percent enhancement in shielding effectiveness. Evidence from space tests indicates that FR4 material becomes less conductive and thus builds stronger fields as the time exposed to vacuum increases beyond several months. In these tests the FR4 was exposed to vacuum for only four hours. Of the two, PMMA is the better material for short times under vacuum. However, a search for superior insulating materials might be very profitable.

Space Spectra on Simple Shield

Figure 7:
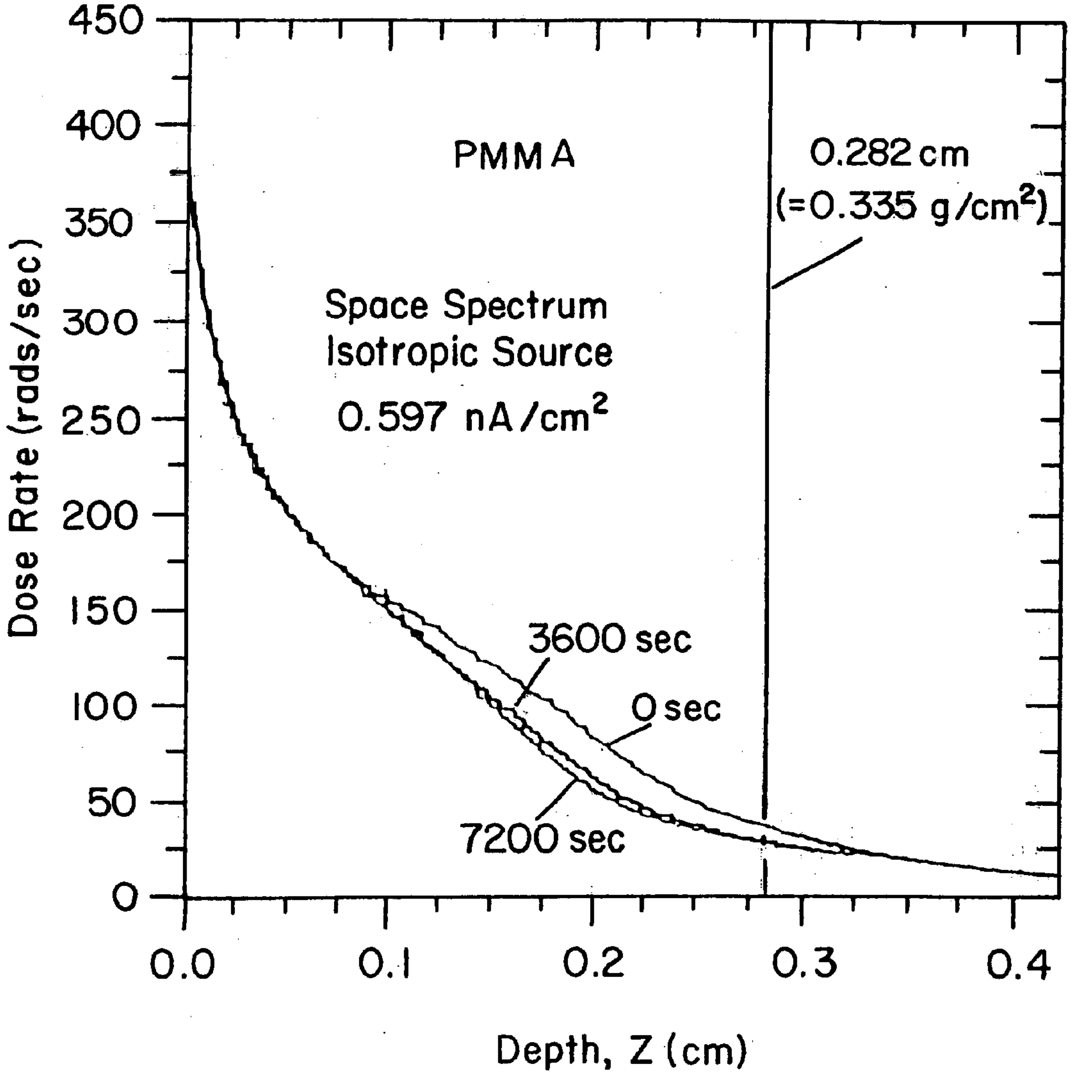
FIG. 7 illustrates the calculated dose rate versus depth for an isotropic space spectrum on 2.82 mm PMMA.

It is important to determine if such shielding enhancement will work for a broad isotropic spectrum in space. Theoretical results for an isotropic spectrum with flux-energy dependence of $F(E)=F_0 E^{-4}$ often seen in the electron belts (with E in MeV) are provided by FIG. 7. This spectrum was cut off below 0.7 MeV and above 2.0 MeV to include only energies where the majority of the penetrating dose occurs with this thickness of shield. Full energy distribution would have made the calculation much longer with little gain. FIG. 7 hints that the greatest shielding enhancement would be provided by a thinner shield. The isotropic broad energy distribution results in nearly as much enhancement of shielding as does the monoenergetic irradiation. Thus we are encouraged that effective shielding enhancement might be achieved in space application. Such shielding thicknesses are comparable to typical electronic box walls on spacecraft.

Vacuum Shield, One Vacuum (FIG. 8A)

Consider the same PMMA samples with the first electrode 20, FIG. 8A, lifted from the surface of the slab 12 and with a vacuum 22 between the PMMA 12 and this electrode 20. The spacecharge fields would then extend from the PMMA into the vacuum to provide shielding in addition to that provided inside the PMMA. The electric field in vacuum provides weightless shielding, and increased vacuum spacing provides increased shielding. A two vacuum shield geometry is shown in FIG. 8B.

Figure 9:
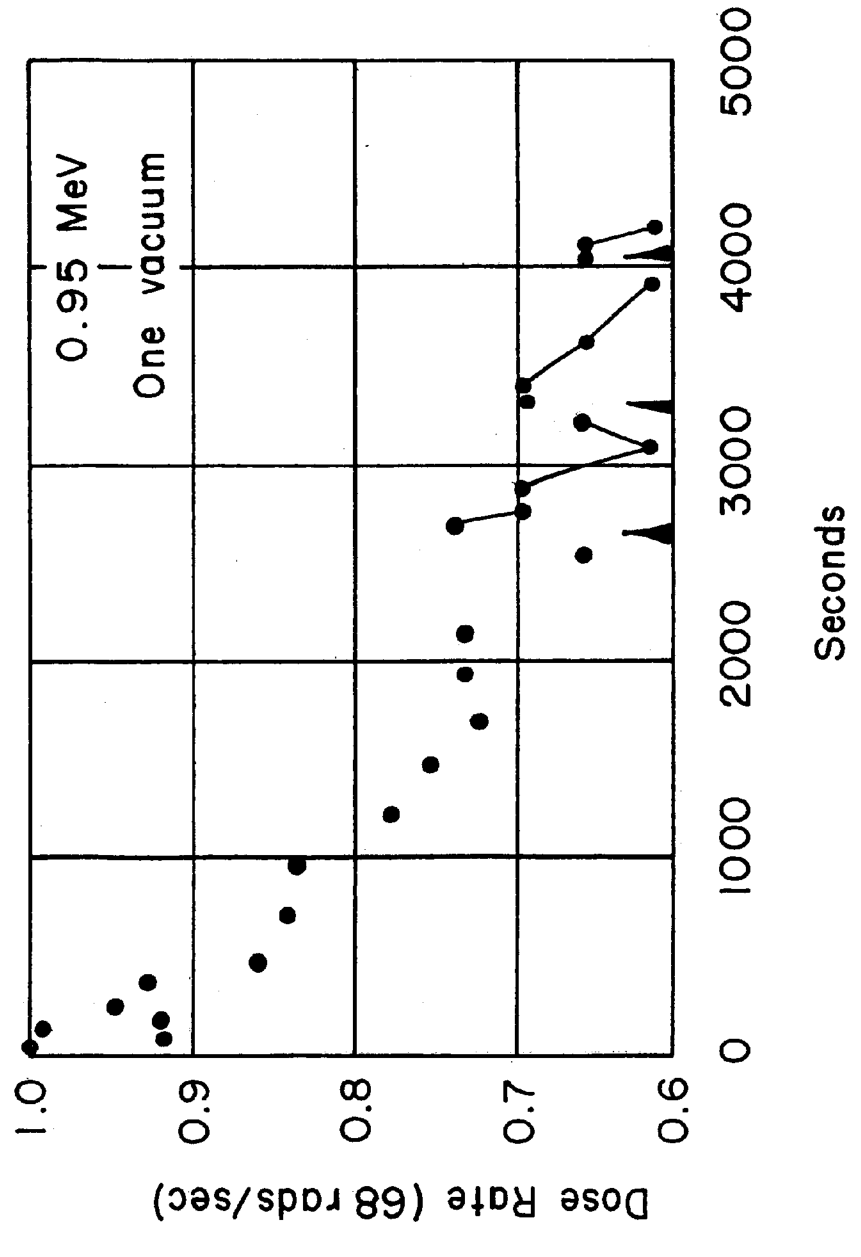
FIG. 9 illustrates the experimental dose rate attenuation by the shield with one vacuum.

The experimental result with one vacuum is shown in FIG. 9. As the insulator was charged, the penetrating dose decreased, as expected. At 2650 seconds the insulator spontaneously discharged and the normalized dose rate jumped from 0.65 to 0.74. The discharge collapsed the electric field in the vacuum and removed its shielding effect. The insulator vacuum was recharged by continued irradiation and spontaneously discharged again at 3280 seconds when the normalized dose rate jumped from about 0.63 to 0.70. Recharging continued again until at 4020 seconds the third discharge pulse occurred when the normalized dose jumped from 0.6 to 0.66. The jump in dose after each discharge approximately indicates the amount of shielding that was being provided by the vacuum electric field just prior to the discharge.

Compare FIG. 9 to FIG. 3 to see that the vacuum case produces better shielding than does the same PMMA slab without the adjacent vacuum. Note that the data in FIG. 9 was obtained at a lower dose rate (68 rads/sec at zero E-field) than was the data in FIG. 3 (100 rads/sec at zero E-field). In the vacuum case, the electric field effect builds up more rapidly because the electrical capacitance of the system is less.

If breakdowns had not occurred, the shielding effectiveness would have continued to increase until nearly no dose penetrated, and the PMMA surface voltage would have continued to increase to nearly 950 kV. Such high voltage can not be maintained by this kind of small vacuum-insulated structure, so it is necessary that the vacuum space breaks down periodically. Nevertheless, over long time periods with many breakdowns the average penetrating dose is decreased relative to the case without the vacuum space.

Vacuum Shield, Two Vacuums (FIG. 8B)

Figure 10:
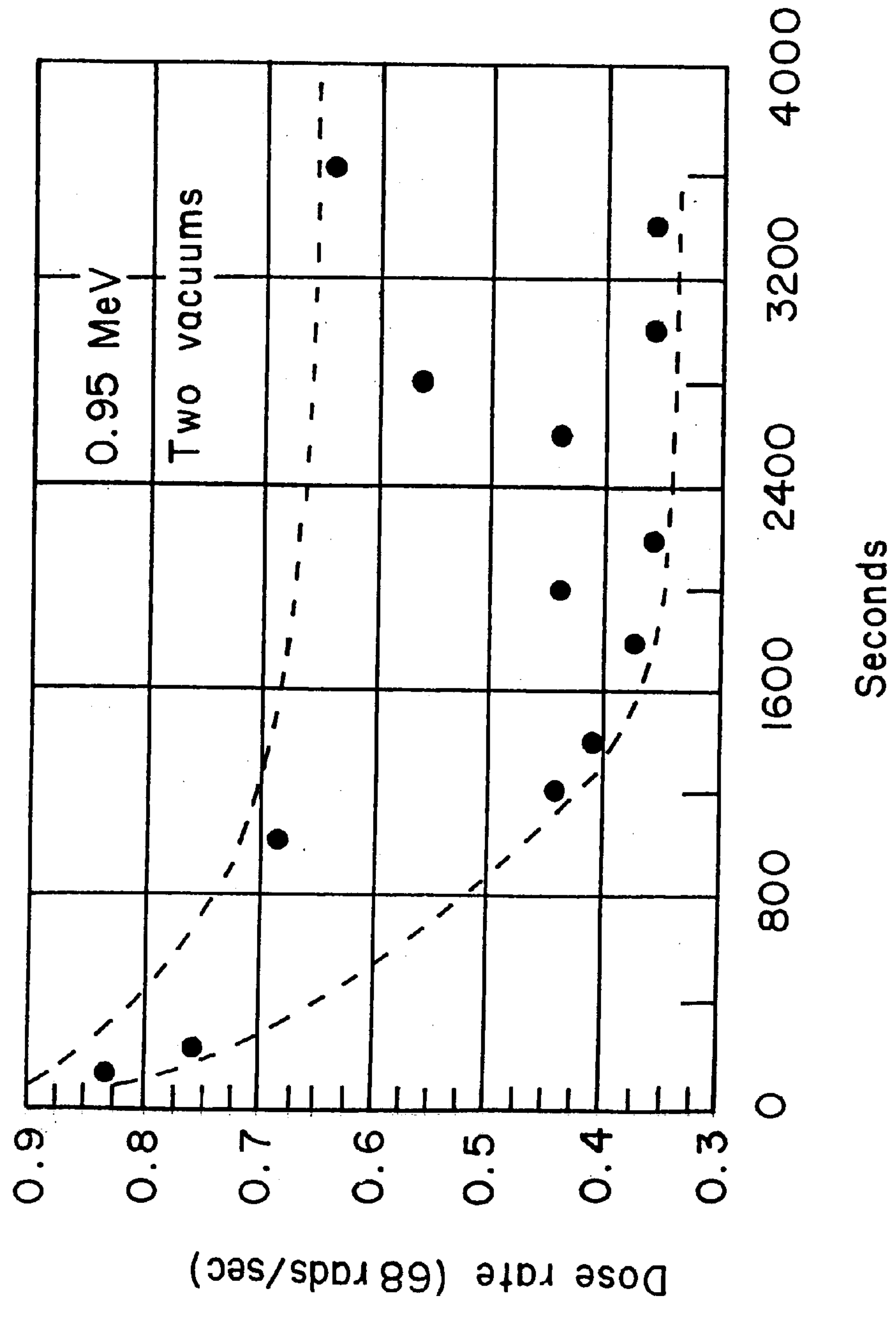
FIG. 10 illustrate the experimental dose rate attenuation by the shield with two vacuums.

In FIG. 8B, both electrodes 20 and 26 are separated from the slab 12 and a vacuum established therebetween, 22 and 24 respectively. The two vacuum case provided greater shielding enhancement (than the one vacuum case) because it produces the larger electric field in front of the PMMA to retard the HE electrons. It also provides vacuum shielding more rapidly because the capacitance is smaller and the surface charging voltages rise more rapidly. However, frequent electrical breakdowns in the experiment began at 150 seconds which briefly collapsed the electric field in the vacuum. The result is described in FIG. 10. The measurements are scattered between two extremes denoted by the dashed lines in FIG. 10. The dose rate was not measured continuously, and the magnitude of the measured dose rate depended strongly on the elapsed time since the previous breakdown.

The shielding was increased as much as a factor of three before the next breakdown reduced it to the same enhancement that was measured in the case with electrodes attached directly on the PMMA. After each breakdown the enhancement would increase until the next breakdown. The average enhancement over time was about a factor of two.

It is instructive to think of the vacuum test results in the following manner. As the insulator charges, the incident HE electrons are slowed in the vacuum to a lower energy of incidence on the PMMA surface. Thus fewer of the electrons penetrate to the dosimeter. Yet the spacecharge is accumulating in the insulator with a depth profile not too different from the depth profile in the case without the vacuum. When the breakdowns occur, the fields in the vacuum become temporarily small and the fields in the insulator become temporarily similar to the fields in the insulator without vacuum. Thus when the breakdowns occur, the penetrating dose rises approximately to that of the no-vacuum test, and then decreases as the vacuum field builds up again. On average, the vacuum cases are expected to produce better shielding than the no-vacuum case.

The insulator charging model was developed and tested for cases without a vacuum. The inclusion of a vacuum is simple in concept but requires new conductivity modeling. The secondary emission current into the vacuum from the insulator is a dominant term which is poorly known. In the process of modeling these results it was learned that the secondary emission yield is increased at least a factor of ten by the high fields, a fact that we have not found in the literature. Thus it is difficult to use existing data to predict the performance of particular embodiments with vacuum spaces.

The shielding enhancement is a real effect that might be put to practical use to save weight on spacecraft. The model correctly predicts penetrating dose. The model could form a basis for improving the design in various applications. Irradiations for longer times are needed to find the ultimate enhancement available. There is no reason to believe that PMMA is the best material.

Vacuum spaces provide improved shielding enhancement, especially if the breakdown rate can be minimized. The experiments, which were not optimized, found shielding enhancement of a factor of 1.4 with the simple (no vacuum) device, and a factor of 2.0 averaged over time for the double vacuum device. Simulations with other spectra, geometries or materials might find significantly greater shielding enhancement.

The shielding enhancement is significant over a limited range of material depth near the shield. Because of this constraint, its application as a local shield immediately on a sensitive device seems most beneficial. One might also conceive of its use as a wall of an electronic box in order to enhance shielding of the adjacent devices.

Clearly many modifications and variations of the present invention are possible in light of the above teachings and it is therefore understood, that within the inventive scope of the inventive concept, that the invention may be practiced otherwise than specifically claimed.

What is claimed is:

1. A radiation shield for incoming high energy electrons comprising, an insulator and two spaced conductive sheets, said insulator being mounted between said sheets, at least one of said conductive sheets being mounted on the outside of said shield nearest the incoming electrons to define an upstream sheet, said upstream sheet being spaced from said insulator to define a gap therebetween, said gap being evacuated, so that radiation-induced charge accumulates in said insulator and in concert with said conductive sheets, generates an electric field which scatters incoming high energy electrons to produce attenuation of dose in proximity with said shield.

2. The radiation shield of claim 1 wherein there are gaps between said insulator and both of said sheets, said gaps being evacuated.

3. The radiation shield of claim 1 wherein said conductive sheet is a film or foil.

4. The radiation shield of claim 1 having means to electrically ground said sheets to prevent development of high voltage external to said shield.

5. The radiation shield of claim 4 wherein there are two of said conductive sheets, each spaced from said insulator to define two evacuated gaps.

6. The radiation shield of claim 1 wherein said insulator is of PMMA.

7. The radiation shield of claim 1 wherein said electron radiation ranges from about 100 KeV to 3 KeV.

* * * * *